(12) United States Patent
Mallikarjunaswamy et al.

(10) Patent No.: US 6,285,177 B1
(45) Date of Patent: Sep. 4, 2001

(54) SHORT-CIRCUIT CURRENT-LIMIT CIRCUIT

(75) Inventors: Shekar Mallikarjunaswamy, San Jose; Brian H. Floyd, Sunnyvale, both of CA (US)

(73) Assignee: Impala Linear Corporation, San Jose, CA (US)

( * ) Notice: Subject to any disclaimer, the term of this patent is extended or adjusted under 35 U.S.C. 154(b) by 0 days.

(21) Appl. No.: 09/566,857

(22) Filed: May 8, 2000

(51) Int. Cl.[7] ................. G05F 3/20; H04J 3/17; H02H 3/18
(52) U.S. Cl. ............... 323/315; 327/437; 361/87
(58) Field of Search ................. 323/315, 312, 323/313, 314; 327/309, 327, 319, 588, 437; 361/100, 91, 93, 87

(56) References Cited

U.S. PATENT DOCUMENTS

| | | | |
|---|---|---|---|
| 4,543,494 | 9/1985 | Wakimoto | 307/200 B |
| 4,612,497 | 9/1986 | Ulmer | 323/315 |
| 4,709,171 | * 11/1987 | Main | 327/327 |
| 4,771,228 | 9/1988 | Hester et al. | 323/315 |
| 5,386,336 | * 1/1995 | Kim et al. | 361/93 |
| 5,579,193 | 11/1996 | Schmidt et al. | 361/18 |
| 6,002,288 | * 12/1999 | Corsi | 327/309 |

* cited by examiner

Primary Examiner—Rajnikant B. Patel
(74) Attorney, Agent, or Firm—Law Offices of Terry McHugh (57) ABSTRACT

A current-limit circuit and a method of limiting current supplied to a load through a power transistor utilize a control transistor that is selectively activated to a conducting state to limit the current conducted through the power transistor in response to a predefined condition. The predefined condition may be a short-circuit condition or an over-current condition. The configuration and operation of the control transistor are such that, when the control transistor is in a conducting state, the current conducted through the power transistor is limited by the structural ratio of the two transistors. However, during normal operating conditions when the control transistor is deactivated to a non-conducting state, the control transistor does not degrade the performance of the power transistor. In a first embodiment, the current-limit circuit is configured to provide protection from a short-circuit condition. In a second embodiment, the current-limit circuit is configured to provide protection from an over-current condition, in addition to protection from a short-circuit condition. In a preferred embodiment, the sense transistor and the power transistor are structurally integrated into a single semiconductor device having a honeycomb structure that allows the size of the sense transistor to be tuned.

20 Claims, 8 Drawing Sheets

SHORT-CIRCUIT CURRENT-LIMIT CIRCUIT

TECHNICAL FIELD

The invention relates generally to circuits and more particularly to a current-limit circuit.

BACKGROUND ART

A short circuit condition in an electrical device can cause an excessive amount of current to be drawn through a power transistor, which may potentially damage the power transistor and other electrical components of the device. Therefore, many electrical devices include a current-limit circuit to limit the amount of current drawn though the power transistor in the event of a short circuit condition. Known current-limit circuits utilize various techniques to provide current limiting protection. Due to the extensive prior use of bipolar transistors, many conventional current-limit circuits are designed for bipolar circuits, which may not be suitable for metal oxide semiconductor (MOS) circuits.

U.S. Pat. No. 4,612,497 to Ulmer describes a current-limit circuit that utilizes MOS technology. The current-limit circuit of Ulmer includes a P-channel metal oxide semiconductor (PMOS) driver transistor. The source of the driver transistor is connected to a supply voltage, while the drain of the driver transistor is coupled to a current mirror. The current mirror is formed of a pair of PMOS transistors. The sources of the current mirror transistors are coupled to the driver transistor. The drain of the first current mirror transistor is connected to an output terminal, while the drain of the second current mirror transistor is connected to electrical ground via a current sink transistor. The drain of the second mirror transistor is also connected to the gates of the first and second mirror transistors. The first current mirror transistor is a power device and is significantly larger than the second current mirror transistor and the current sink transistor. During normal operating conditions, the first mirror current transistor operates in a non-saturated region and the amount of current sourced by the first mirror current transistor to the output terminal is not limited. However, when the first mirror current transistor becomes saturated by increased supply of current beyond a threshold value, the current sourced by the first current mirror transistor is limited, due to the current mirror effect.

A concern with the current-limit circuit of Ulmer is that current is consistently drawn through the second current mirror transistor and the current sink transistor, even during normal operating conditions. Thus current-limit circuit of Ulmer is implemented in a portable electrical device, power dissipation may become an issue.

Although known current-limit circuits, including the current-limit circuit of Ulmer, operate well for their intended purpose, what is needed is a current-limit circuit that provides short-circuit protection without significant power dissipation during normal operating conditions.

SUMMARY OF THE INVENTION

A current-limit circuit and a method of limiting current supplied to a load through a power transistor utilize a control transistor that is selectively activated to a conducting state to limit the current conducted through the power transistor in response to a predefined condition. The predefined condition may be a short-circuit condition or an over-current condition. The configuration and operation of the control transistor are such that, when the control transistor is in a conducting state, the current conducted through the power transistor is limited by the structural ratio of the two transistors. However, during normal operating conditions when the control transistor is deactivated to a non-conducting state, the control transistor does not degrade the performance of the power transistor.

In a first embodiment, the current-limit circuit is configured to provide protection from a short-circuit condition. In this embodiment, the current-limit circuit includes the power transistor, the control transistor, a current source and a switching transistor. Each of these transistors is an N-channel metal oxide semiconductor (NMOS) transistor. The power transistor is configured as a source follower between a supply voltage ($V_{DD}$) rail and an output terminal. The gates of the power and control transistors are coupled to each other and to the current source. The current source is configured to receive a high voltage current from an external source, such as a charge pump. The switching transistor is connected between the control transistor and the output terminal. The gate of the switching transistor is supplied with $V_{DD}$.

Under normal operating conditions, both the control and switching transistors are deactivated to a non-conducting state. However, when a short-circuit condition occurs, the switching transistor is automatically activated to a conducting state, since the voltage on the output terminal is driven to zero or near zero. The activation of the switching transistor also activates the control transistor to a conducting state. Due to the electrical arrangement of the control transistor and the power transistor, the amount of current conducted through the power transistor is then limited by the structural ratio of these transistors.

In a second embodiment, the current-limit circuit is configured to provide protection from an over-current condition, in addition to protection from a short-circuit condition. In this embodiment, the current-limit circuit further includes a resistor and a sense transistor that are connected in series between the $V_{DD}$ rail and the output terminal. The sense transistor is gate coupled to the power transistor. The current-limit circuit of the second embodiment also includes an over-current control device and a switch. The over-current control device is connected to a node between the resistor and the sense transistor to sense the voltage at the node. The voltage at the node varies in accordance with the amount of current being conducted through the power transistor. Thus, by sensing the voltage at the node, the over-current control device can detect when the current conducted through the power transistor exceeds a prescribed threshold current level. The over-current control device is also connected to the switch that can provide a conduction path from the control transistor to the output terminal when the switch is closed.

Under normal operating conditions, the switch is open. Thus, the control transistor is deactivated to a non-conducting state. However, when the current conducted through the power transistor exceeds the threshold current level, the over-current control device sends a close signal to the switch to connect the control transistor to the output terminal. When the control transistor is connected to the output terminal, the control transistor is activated to a conducting state, which limits the current being conducted through the power transistor to a lower level.

In a preferred embodiment, the sense transistor and the power transistor are structurally integrated into a single semiconductor device. The integrated device is a honeycomb structure that is composed of a number of adjacent cell blocks. Each cell block of the integrated device includes a number of source, main drain and dummy drain cells. These cells are positioned in an alternating fashion such that an adjacent cell of a source cell is either a main drain cell or a dummy drain cell. Each cell block also includes a body contact region that is positioned around the cells. Thus, the body contact region is located in the periphery of a cell block.

The electrical connections to the cells and the body contact regions of the cell blocks are provided by M1 metallizations and M2 metallizations. The M1 metallizations are formed of a first layer of metal positioned over the cells and the body contact regions, while the M2 metallizations are formed of a second layer of metal positioned over the M1 metallizations. For each cell block, the main drain cells are connected to M1 main drain metallizations, while the dummy drain cells are connected to at least one M1 dummy drain metallization. The M2 metallizations that overlay the M1 metallizations include an M2 main drain metallization and a number of M2 sense drain metallizations. By selectively configuring the M2 metallizations and selectively connecting the M1 dummy drain metallizations to either the M2 main drain metallization or the M2 sense drain metallizations, the dummy drain cells can become the drain of the power transistor or the drain of the sense transistor. Thus, the size of the sense transistor can be tuned by the M2 metallizations, after the M1 metallizations are formed.

DETAILED DESCRIPTION

Figure 1:
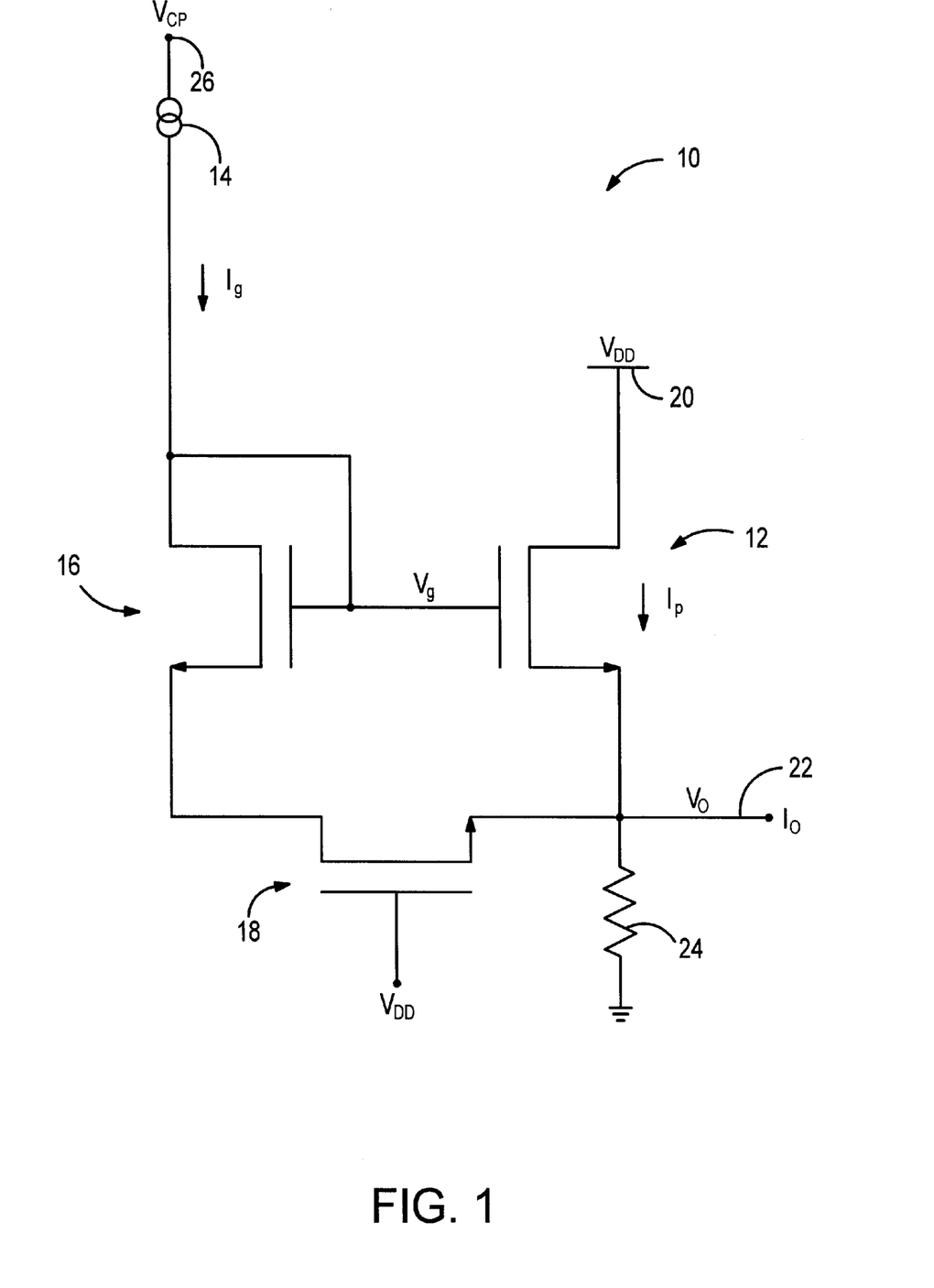
FIG. 1 is a schematic diagram of a current-limit circuit in accordance with a first embodiment of the present invention.

With reference to FIG. 1, a current-limit circuit 10 in accordance with a first embodiment of the present invention is shown. The current-limit circuit includes a power transistor that provides the output current $I_O$ to a load. The current-limit circuit is designed to effectively limit the amount of the output current $I_O$ being supplied to the load in the event of a short-circuit condition. In addition, the current-limit circuit is designed such that the performance of the power transistor is not degraded during normal operating conditions.

The current-limit circuit 10 includes the power transistor 12, a current source 14, a control transistor 16 and a switching transistor 18. The transistors 12, 16 and 18 are N-channel metal oxide semiconductor (NMOS) transistors. The power transistor provides a current path between a supply voltage ($V_{DD}$) rail 20 and an output terminal 22. The power transistor is configured as a source follower. Thus, the drain of power transistor is connected to the $V_{DD}$ rail, while the source of the power transistor is connected to the output terminal. The output terminal 22 supplies the output current $I_O$ to the load. The resistance of the load is represented by a resistor 24, which is schematically shown in FIG. 1 to be connected to the output terminal and electrical ground.

The current source 14 and the transistors 16 and 18 are connected in series between a high voltage node 26 and the output terminal 22. The voltage at the node 26 may be a voltage $V_{CP}$ supplied by a charge pump (not shown). The current source supplies the current $I_g$ to the drain and the gate of the control transistor 16. The control transistor is coupled to the power transistor 12 in a current mirror configuration. Thus, the gate of the control transistor is coupled to the gate of the power transistor. The current mirror configuration of the two transistors 12 and 16 allows the output current $I_O$ to be limited by controlling the current $I_p$ drawn through the power transistor, during a short-circuit condition.

The switching transistor 18 of the current-limit circuit 10 provides a conduction path between the control transistor 16 and the output terminal 22. The drain of the switching transistor is coupled to the source of the control transistor 16, while the source of the switching transistor is coupled to the output terminal 22. The gate of the switching transistor is supplied with $V_{DD}$. The configuration of the switching transistor is such that, under normal operating conditions, it is deactivated to a non-conductive state. Consequently, the control transistor is also deactivated to a non-conducting state. However, when the output terminal is shorted to electrical ground, the switching transistor is activated to a conducting state, which in turn activates he control transistor. When the control transistor is activated, the current $I_p$ through the power transistor 12 is limited by the structural ratio of the control transistor and the power transistor.

Initially, the voltage $V_O$ on the output terminal 22 is zero. As the current source 14 provides the current $I_g$ to the gates of the power and control transistors 12 and 16, the voltage $V_g$ at the gates of these transistors rises, which allows an increasing amount of current $I_p$ to be conducted through the power transistor 12. Under a normal load operation, the output voltage $V_O$ will rise to $V_{DD}-V_{ds,sat}$, where $V_{ds,sat}$ is the saturation voltage of the control transistor 16. With this rise of the output voltage $V_O$, the switching transistor 18 is deactivated to a non-conducting state and the current $I_g$ will charge the gate of the power transistor to a level where the gate voltage $V_g$ is greater than the supply voltage $V_{DD}$, which lowers the $R_{DS}$ of the power transistor. Thus, under a normal load operation, the current-limit circuit 10 will not degrade the performance of the power transistor.

However, under a short-circuit condition, the switching transistor 18 is activated to a conducting state since the output voltage $V_O$ equals zero or near zero. The activation of the switching transistor allows the current $I_g$ to be conducted through the control transistor 16. Consequently, the current $I_p$ conducted through the power transistor 12 is limited to current $I_{limit}$ by the structural ratio of the control transistor and the power transistor. The current limit ($I_{limit}$) through the power transistor can be expressed as:

$$I_{limit} \equiv \left(\frac{W_2/L_2}{W_1/L_1}\right)I_g \cong I_O \qquad \text{(Eq. 1)}$$

where $W_1$ and $L_1$ are the dimensions of the control transistor, and $W_2$ and $L_2$ are the dimensions of the power transistor. Thus, the output current $I_O$ will also be limited to the current $I_{limit}$ plus a small amount of current conducted through the control and switching transistors 16 and 18. In this manner, the current-limit circuit 10 provides a current limit protection in the event of a short-circuit condition.

Figure 2:
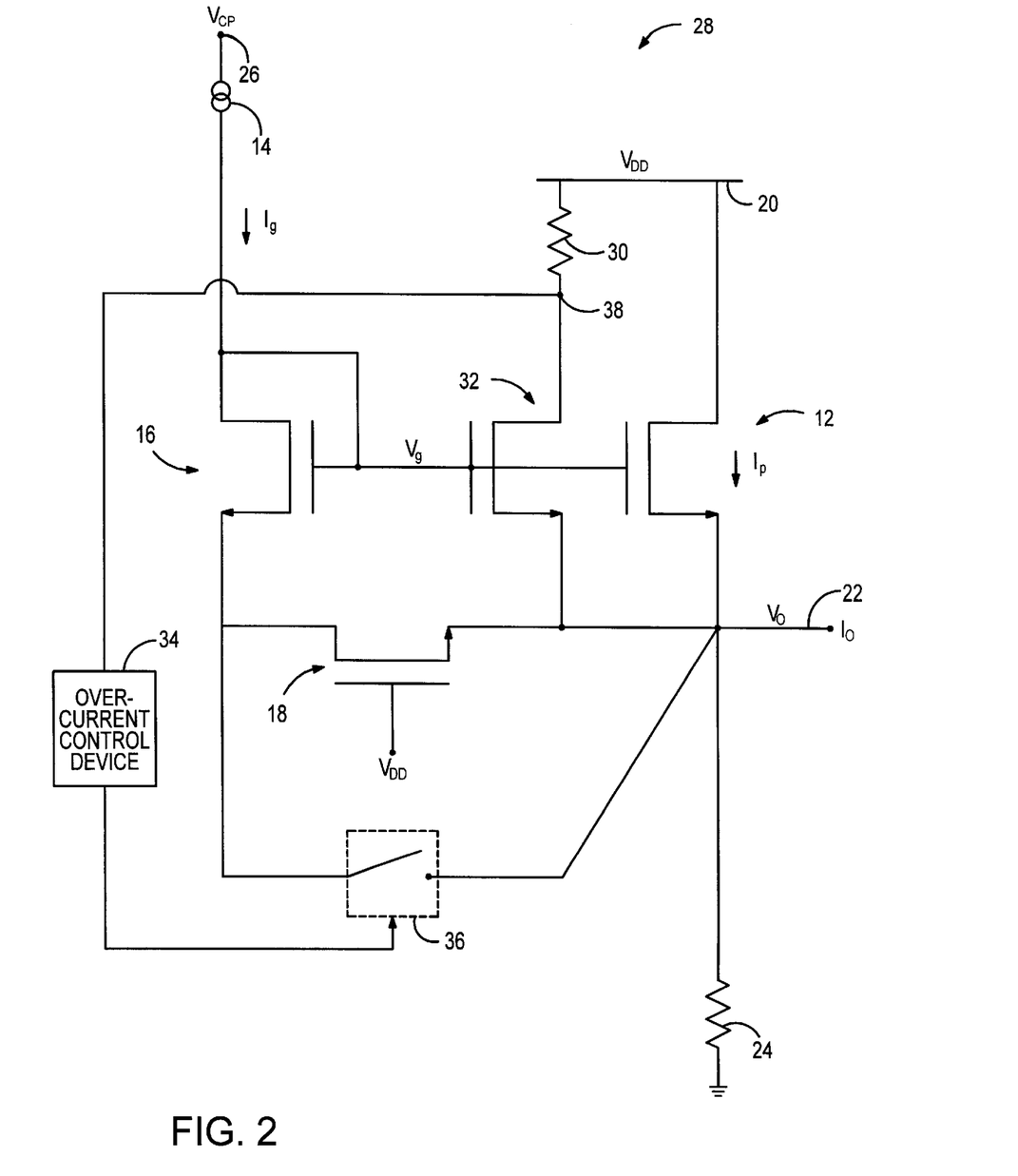
FIG. 2 is a schematic diagram of a current-limit circuit in accordance with a second embodiment of the invention.

Turning now to FIG. 2, a current-limit circuit 28 in accordance with a second embodiment of the invention is shown. The current-limit circuit includes all of the components of the current-limit circuit 10 of FIG. 1. Therefore, the reference numerals of FIG. 1 will be used to identify the same components in FIG. 2. Since the current-limit circuit 28 of FIG. 2 includes all of the components of the circuit 10 of FIG. 1, the current-limit circuit 28 also operates to limit the output current $I_O$ in the event of a short-circuit condition. However, the current-limit circuit 28 of FIG. 2 further includes additional components that provide an over-current protection.

The current-limit circuit 28 includes a resistor 30 and a sense transistor 32 that are connected in series between the $V_{DD}$ rail 20 and the output terminal 22. Thus, the resistor 30 and the sense transistor are connected in parallel to the power transistor 12. One side of the resistor 30 is connected to the $V_{DD}$ rail, while other side of the resistor is connected to the drain of the sense transistor. The gate of the sense transistor is connected to the gate of the power transistor 12, while the source of the sense transistor is connected to the output terminal. Similar to the power transistor, the sense transistor is an NMOS transistor. However, the sense transistor is sized much smaller than the power transistor. As an example, the structural ratio of the power transistor to the sense transistor may be 100:1.

The current-limit circuit 28 also includes an over-current control device 34 and a switch 36. The over-current control device control is connected to a node 38 located between the resistor 30 and the sense transistor 32 to sense the voltage at that node. This voltage is used by the over-current control device to monitor the current $I_p$ through the power transistor. The over-current control device is connected to the switch 36, which provides a conduction path between the control transistor 16 and the output terminal 22 when the switch is closed. The over-current control device provides a control signal to the switch to open or close the switch. The over-current control device is configured to transmit a close signal to the switch when the voltage at the node 38 indicates that the current $I_p$ is above a prescribed threshold current level. When the switch is closed, the current $I_g$ is conducted through the control transistor 16, which limits the current $I_p$ through the power transistor 12. Thus, the current $I_p$ folds back to a lower current level when it exceeds the threshold current level. The value of the lower current level will depend on the operating point, e.g., the load condition.

Under normal conditions, the switching transistor 18 and the switch 36 are open such that current is not conducted through the control transistor 16 to the output terminal 22. However, when the output terminal is shorted to electrical ground or to near electrical ground, the switching transistor 18 is automatically activated to a conducting state. The activation of the control transistor allows the current $I_g$ to flow through the control transistor, which limits the current $I_p$ conducted through the power transistor 12. In addition, when the current $I_p$ exceeds the prescribed threshold current level, the over-current control device 34 transmits a close signal to the switch 36 to reduce the amount of output current $I_O$. When the switch is closed, the control transistor 16 is activated to a conducting state. The activation of the control transistor allows current $I_g$ to be conducted through the control transistor, which reduces the output current $I_O$ by lowering the current $I_p$ to a lower current level. Thus, the current-limit circuit 28 provides protection from an over-current condition, as well as a short-circuit condition.

Figure 3:
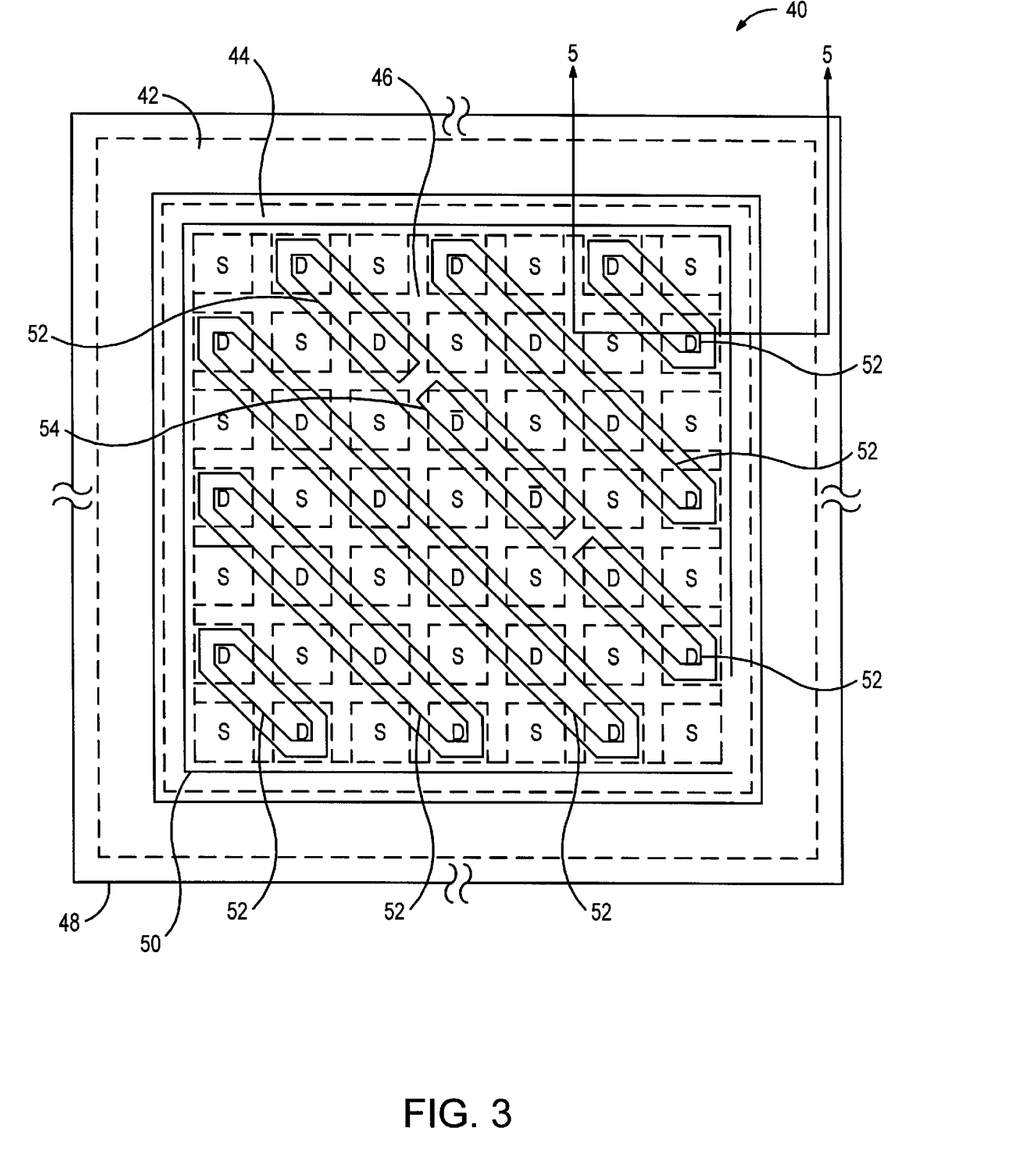
FIG. 3 is a top view of a cell block that can be incorporated into a semiconductor structure to form an integrated sense/power transistor structure in accordance with the invention.
Figure 4:
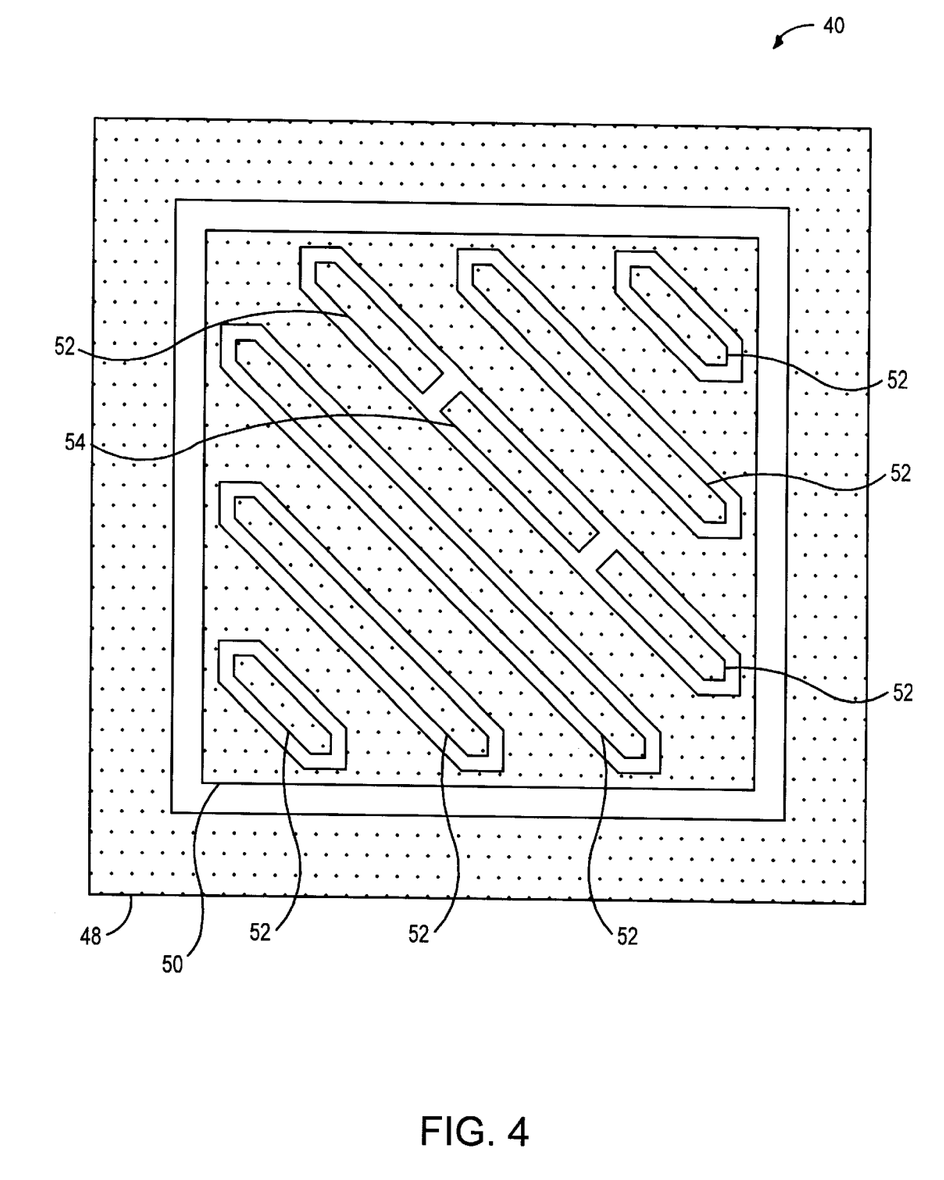
FIG. 4 is a top view of the cell block of FIG. 3, where the cells and the body region of the cell block are not shown.

In a preferred embodiment, the sense transistor 32 and the power transistor 12 are structurally integrated into a single semiconductor device, which is composed of a number of adjacent cell blocks. A single cell block 40 is illustrated in FIGS. 3 and 4. FIG. 3 is a top view of the cell block, while FIG. 4 is a simplified top view of the cell block. The cell block includes N×M cells, as illustrated by the squares in FIG. 3. A device having such a configuration is commonly known as a honeycomb structure. Although the cell block of FIG. 3 is shown to include only 7×7 cells, the cell block may include additional cells or fewer cells. Each cell of the cell block is either a source cell or drain cell of the sense transistor or the power transistor. The source cells are indicated in FIG. 3 by "S", while the main drain cells are indicated by "D". The two drain cells that are indicated by "$\overline{D}$" are dummy drain cells.

The cell block 40 of the integrated semiconductor device also includes a body contact region 42 that is positioned around the periphery of the cell block. The body contact region is separated from the source and drain cells by a boundary of field oxide (FOX) region 44, while the drain and source cells are separated from each other by a gate 46. Positioned over the body contact region and the source and drain cells are M1 metallizations 48, 50, 52 and 54, which are formed by patterning a layer of metal. The source cells are collectively connected to each other by the M1 source metallization 50. The main drain cells are connected to one of the M1 main drain metallizations 52, which are collectively connected by an M2 metallization to be described below. The dummy drain cells are collectively connected to the M1 dummy drain metallization 54. The M1 metallizations are more clearly identifiable in FIG. 4, where the body contact region 42 and the source, main drain and dummy drain cells are not shown. The source cells form the common source for the sense transistor 32 and the power transistor 12 of FIG. 2. The main drain cells form the drain of the power transistor. However, the dummy drain cells $\overline{D}$ can either be the drain of the sense transistor or the drain of the power transistor, depending on the connection of the M1 dummy drain metallization 54 to an overlying M2 metal layer. The connection of the dummy drain cells to the overlying M2 metal layer will be described below in reference to FIG. 6.

Figure 5:
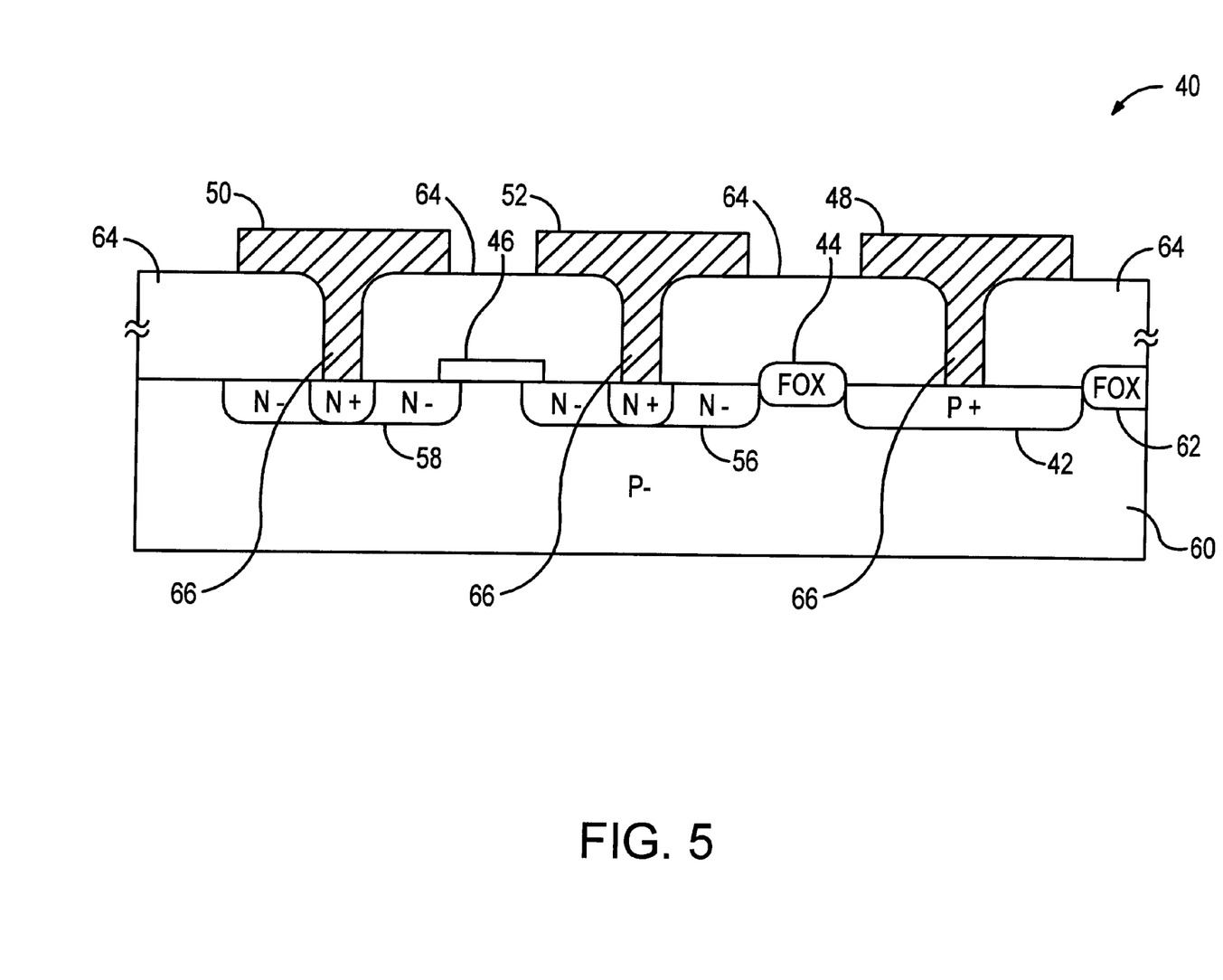
FIG. 5 is a cross-sectional view of a portion of the cell block of FIG. 3.

Turning now to FIG. 5, a cross-sectional view of a portion of the cell block 40 is shown. Illustrated in FIG. 5 are a drain cell 56, a source cell 58 and the body contact region 42 of the cell block 40, which are formed in a P-type substrate 60. Each of the drain and source cells includes a heavily N-doped region within a lightly N-doped region. The body contact region is a heavily P-doped region. The gate 46 separates the source cell from the drain cell. The gate may be formed of a poly-silicon. The FOX region 44 separates the drain cell from the body contact region. A FOX region 62 separates the body contact region 42 from a body contact region of an adjacent cell block (not shown). A CVD oxide layer 64 is positioned over the body contact region and the source and drain cells. The CVD oxide layer includes vias 66 that allow the M1 metallizations 48, 50 and 52 to be in contact with the body contact region 42, the source cell 58, and the drain cell 56, respectively.

Figure 6:
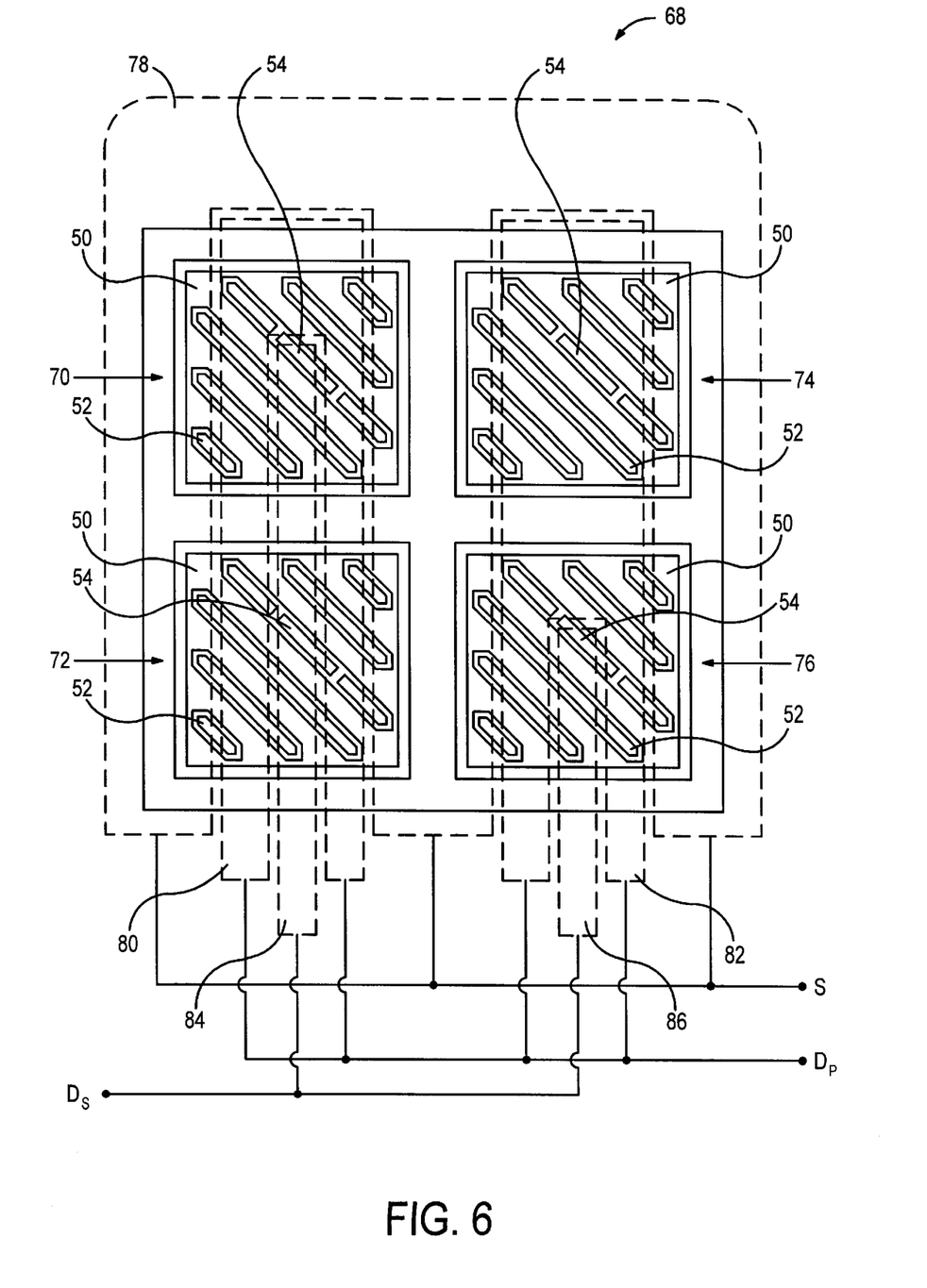
FIG. 6 is a top view of the integrated sense/power transistor structure in accordance with the invention.

FIG. 6 illustrates the manner in which cell blocks, identical to the cell block 40 of FIG. 3, are arranged and electrically connected to form an integrated sense/power transistor device 68. As shown in FIG. 6, the integrated device includes only four cell blocks 70, 72, 74 and 76. However, additional cell blocks can be included to form a larger integrated sense/power transistor device. For simplification, the source cells, the drain cells, the dummy drain cells and the body contact regions of the cell blocks are not illustrated in FIG. 6. Instead, only the M1 metallizations 50, 52 and 54 that are connected to the source cells, the drain cells and the dummy drain cells of the cell blocks are shown.

The integrated sense/power transistor device 68 includes M2 metallizations 78, 80, 82, 84 and 86 that overlay the M1 metallizations 50, 52 and 54 of the cell blocks 70, 72, 74 and 76. The M2 source metallization 78 is connected to the M1 source metallizations 50, which are connected to the source cells of the cell blocks 70–76. Thus, each source cell of the cell blocks 70–76 is connected to the M2 source metallization. The M2 main drain metallizations 80 and 82 are connected to the M1 main drain metallizations 52. Thus, each main drain cell of the cell blocks 70–76 is connected to one of the M2 main drain metallizations 80 and 82. The M2 sense drain metallizations 84 and 86 are connected to the M1 dummy drain metallizations 54 of the cell blocks 70, 72 and 76. However, the M1 dummy drain metallization 54 of the cell block 74 is not connected to one of the M2 sense drain metallizations. Instead, the M1 dummy drain metallization of the cell block 74 is connected to the M2 main drain metallization 82. Therefore, the dummy drain cells of the cell block 74 have become a part of the drain of the power transistor, rather than a part of the drain of the sense transistor. By selectively connecting the dummy drain cells to either one of the M2 sense drain metallizations 84 and 86 or one of the M2 main drain metallizations 80 and 82, the size of the resulting sense transistor of the integrated device 68 can be defined. Even with just four cell blocks, as illustrated in FIG. 6, the drain of the sense transistor can be tuned to be composed of two, four, six or eight dummy drain cells. Although the M2 main drain metallizations 80 and 82 are shown in FIG. 6 as separate metallizations, these metallizations may be configured to be a single metallization that surrounds each of the M2 sense drain metallizations 84 and 86.

The configuration of the integrated sense/power transistor device 68 provides a number of advantages. First, since each cell block includes an incorporated body region, the ruggedness of the device is improved. The location of the body also prevents snap-back and improves the resistance of the base. Second, the lateral shapes of the M2 metallizations 78, 80, 82, 84 and 86 can be changed to increase the drain size of the sense transistor, even after the M1 metallizations 50, 52 and 54 have been fabricated. This can be achieved by selectively connecting the M1 dummy drain metallizations 54 to the M2 sense drain metallizations 84 and 86 to form the drain of the sense transistor 32. In this fashion, the size of the sense transistor can be tuned by selecting the configuration of the M2 metallizations.

Figure 7:
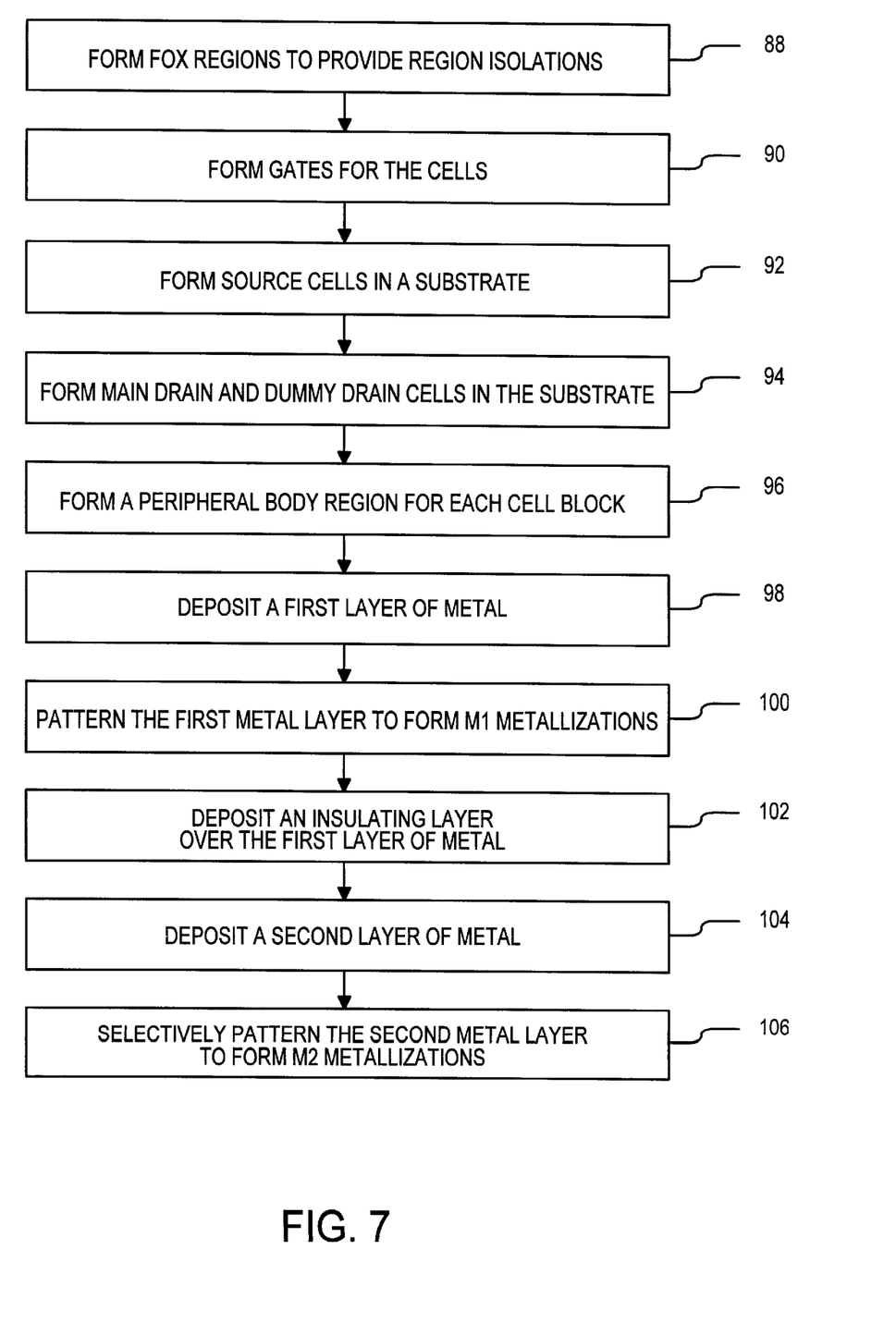
FIG. 7 is a flow diagram of a method of fabricating an integrated sense/power transistor structure in accordance with the invention.

A method of fabricating an integrated sense/power transistor device in accordance with the invention will be described with reference to FIG. 7. The integrated sense/power transistor device is a honeycomb structure that includes cells that form the common source and the two drains of a sense transistor and a power transistor. During steps 88 and 90, the FOX regions are formed to provide the desired region-to-region isolations and gates are formed within each cell block of the honeycomb structure. The processes for forming FOX regions and gates are well known in the art. For example, gates may be formed by patterning a thin dielectric layer and a polysilicon layer. Then, when the ion implantation steps for forming the source and drain regions are executed, the presence of the polysilicon provides self alignment of the regions.

In steps 92 and 94, source, main drain and dummy drain cells are formed in a substrate. These cells are positioned such that the cell adjacent to each source cell is either a main drain cell or a dummy cell. Thus, the cells are positioned in an alternating fashion where every other cell is a source cell. The substrate may be a P-type substrate, where each of the source, main drain and dummy drain cells includes a heavily N-doped region within a lightly N-doped region. Steps 92 and 94 may be executed simultaneously by a single ion implantation of the selected dopant. Next, during step 96, a body contact region for each cell block is formed in the substrate. Preferably, each body contact region is located in the periphery of a cell block. In an alternative method, the body contact regions may be formed prior to the source, main drain and dummy drain cells.

During step 98, a first layer of metal is deposited over the cells and the body regions of the integrated sense/power transistor device. The deposited metal layer is then patterned to form M1 metallizations, during step 100. For each cell block, the first metal layer is patterned to form an M1 source metallization, an M1 body contact metallization, an M1 dummy drain metallization, and a number of M1 main drain metallizations. The number of M1 main drain metallizations will depend on the number of main drain cells included in each of the cell blocks. Next, during step 102, an insulating layer is deposited over the first layer of metal. A second layer of metal is then deposited over the insulating layer, during step 104. Next, during step 106, the second layer of metal is selectively patterned to form M2 source, M2 main drain and M2 sense drain metallizations, where each M2 metallization is connected to one or more M1 metallizations. The patterning of the second metal layer will depend on the desired size of the sense transistor. If a larger sense transistor is desired, more dummy drain cells will be electrically connected to M2 sense drain metallizations by connecting more M1 dummy drain metallizations to the M2 sense drain metallizations. Thus, the drain size of the sense transistor can be tuned by selectively patterning the second metal layer and selectively connecting the resulting M2 sense drain metallizations to the M1 dummy drain metallizations.

Figure 8:
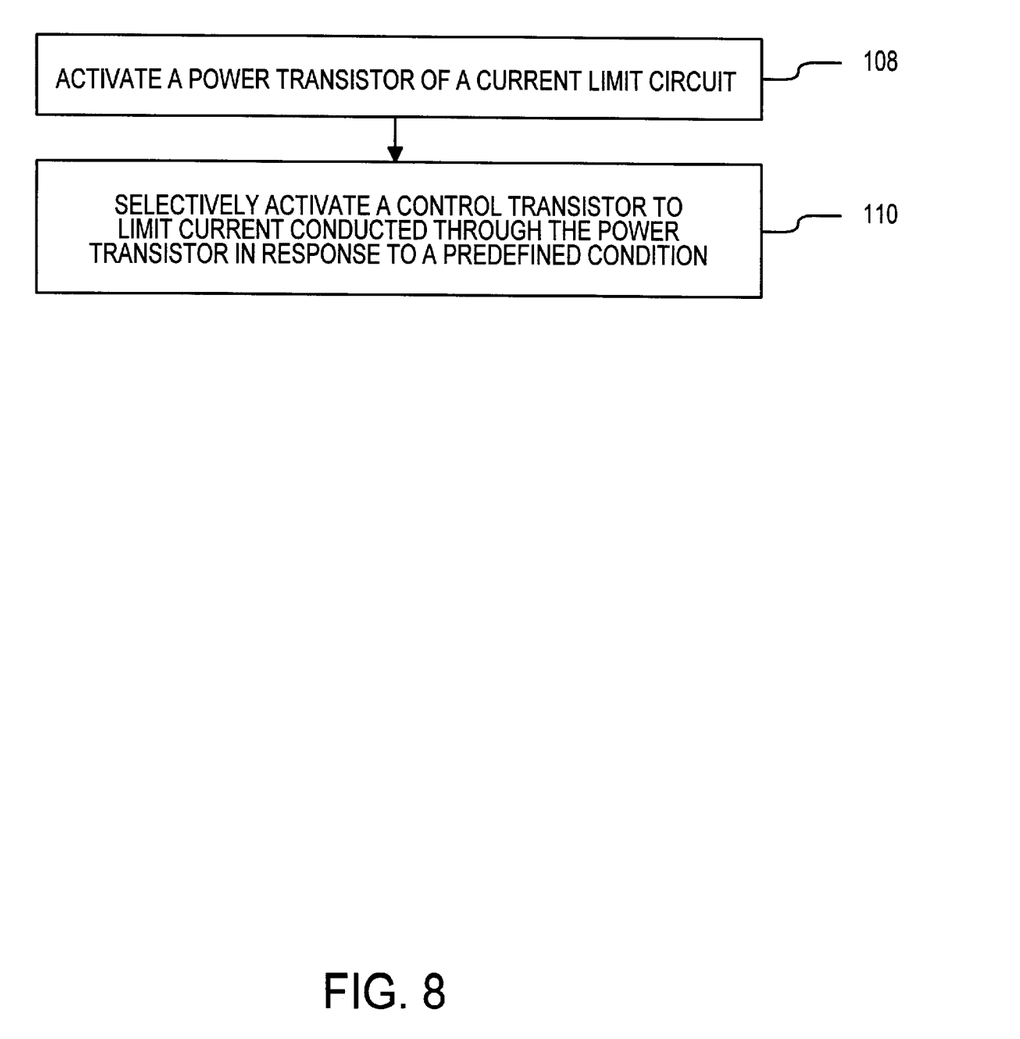
FIG. 8 is a flow diagram of a method of limiting the output current using a current-limit circuit in accordance with the invention.

A method of limiting an output current using a current-limit circuit in accordance with the invention will be described with reference to FIG. 8. During step 108, a power transistor is activated to a conducting state to conduct current to an output terminal. Next, during step 110, a control transistor is selectively activated to a conducting state in response to a predefined condition. The control transistor is gate coupled to the power transistor such that the current drawn through the power transistor is limited by the structural ratio of the two transistors when current is conducted through the control transistor. The predefined condition is either a short-circuit condition or an over-current condition. Under normal operating conditions, the control transistor is deactivated to a non-conducting state. However, when a short-circuit condition occurs, a switching transistor connected between the control transistor and the output terminal is automatically switched from a non-conducting state to a conducting state. This in turn activates the control transistor to the conducting state to limit the current conducted through the power transistor, effectively limiting the amount of output current supplied to the output terminal.

Similarly, when an over-current condition occurs, a conduction path between the control transistor and the output terminal is closed to activate the control transistor, which reduces the current conducted through the power transistor. In order to detect an over-current condition, the amount of current being conducted through the power transistor is monitored by sensing a voltage on a current path that includes a resistor and a sense transistor.

While the invention has been described and illustrated as being implemented with NMOS transistors, PMOS transistors may be substituted if appropriate circuitry changes are designed.

What is claimed is:

1. A current-limit circuit comprising:
    an output transistor connected between a high voltage rail and an output terminal;
    a control transistor coupled to said output transistor in a current-mirror configuration, said control transistor having first and second source/drain regions connected between a current source and said output terminal, said control transistor being configured to limit current drawn through said output transistor when said control transistor is in a conducting state; and
    control circuitry operatively coupled to said control transistor to selectively activate said control transistor from a non-conducting state during normal operating conditions to said conducting state in response to one of short-circuit condition and over-current condition.

2. The circuit of claim 1 wherein said control circuitry includes a switching means connected between said control transistor and said output terminal for selectively connecting said control transistor to said output terminal in response to said short-circuit condition.

3. The circuit of claim 1 wherein said output transistor and said control transistor are arranged such that a voltage on control nodes of said output and control transistor exceeds a voltage provided by said high voltage rail when said control transistor is in a non-conducting state.

4. The circuit of claim 1 further comprising an over-current control circuitry that selectively provides a conducting path between said control transistor and said output terminal when said current conducted through said output transistor exceeds a threshold value.

5. The circuit of claim 4 wherein said over-current control circuitry includes a sense transistor coupled in parallel to said output transistor.

6. The circuit of claim 5 wherein said sense transistor and said output transistor are structurally integrated into a single semiconductor device, said device being a multi-cell structure.

7. The circuit of claim 6 wherein said semiconductor device includes a plurality of cell blocks, each cell block containing source cells and drain cells that are positioned in an alternating fashion.

8. The circuit of claim 7 wherein said semiconductor device includes a first patterned metal layer over said plurality of cell blocks, said first patterned metal layer including, for each cell block, a dummy drain metal region and a drain metal region, said dummy drain metal region being connected to one or more drain cells.

9. The circuit of claim 8 wherein said semiconductor device further includes a second patterned metal layer over said first patterned metal layer, said second patterned metal layer including a main drain metal region and a sense drain metal region, said sense drain metal region being selectively connected to one or more dummy drain regions of said first patterned metal layer to define a drain of said sense transistor.

10. The circuit of claim 7 wherein each cell block includes a body contact region that is located in the periphery of said cell block such that said source cells and said drain cells of said cell block are substantially enclosed in said body region.

11. A method of limiting output current supplied to an output terminal comprising steps of:
    activating an output transistor to a conducting state to provide said output current to said output terminal; and
    selectively activating a control transistor from a continuously non-conducting state during normal operating conditions to a conducting state in response to one of short-circuit condition and over-current condition, including connecting said control transistor to said output terminal, said control transistor being coupled to said output transistor such that control nodes of said control and output transistors are connected, said selective activation of said control transistor having the effect of limiting current being conducted through said output transistor.

12. The method of claim 11 wherein said step of connecting said control transistor to said output terminal includes a step of activating a switching transistor that is connected between said control transistor and said output terminal to a conducting state in response to said short-circuit condition.

13. The method of claim 11 wherein said step of selectively activating said control transistor includes monitoring said current being conducted through said output transistor to detect when said current exceeds a threshold value, said detection being utilized for said selective activation of said control transistor.

14. The method of claim 13 wherein said step of monitoring said current being conducted through said output transistor includes a step of sensing a voltage on a current path that is connected in parallel to said output transistor for said detection, said current path including a sense transistor.

15. A method of fabricating an integrated device that includes a sense transistor and a power transistor comprising steps of:
    forming main drain cells and dummy drain cells in a substrate, at least one of said main drain cells being formed as a drain for said power transistor, at least one of said dummy drain cells being formed as a drain for one of said power transistor and said sense transistor;
    depositing a first layer of metal over said main and dummy drain cells;
    patterning said first layer of metal to form a plurality of first conductive regions, each first conductive region being connected to at least one of said dummy drain cells;
    depositing a second layer of metal over said first layer of metal; and
    selectively patterning said second layer of metal to form a second conductive region, including selectively connecting said second conductive region to selected first conductive regions to define the drain of said sense transistor.

16. The method of claim 15 further comprising a step of forming a plurality body contact regions that substantially surround selected main and dummy drain cells, each body contact region defining a border for a cell block that forms a portion of said integrated device.

17. The method of claim 15 further comprising a step of forming a plurality of source cells.

18. The method of claim 17 wherein said step of forming said plurality of source cells includes a step of positioning said source cells relative to said main and dummy drain cells such that a cell that is adjacent to each source cell is one of said main and dummy drain cells.

19. The method of claim 15 wherein said substrate is composed of a first conductivity type and wherein said main and dummy drain cells are composed of a second conductivity type.

20. The method of claim 15 wherein said step of selectively patterning said second layer of metal includes forming a third conductive region from said second layer of metal, including connecting said third conductive region to said first conductive regions of said first layer of metal that are not connected to said second conductive region, said third conductive region being an electrical contact for the drain of said power transistor.

\* \* \* \* \*